US010270460B1

(12) United States Patent
Buffa et al.

(10) Patent No.: US 10,270,460 B1
(45) Date of Patent: Apr. 23, 2019

(54) COARSE-FINE QUANTIZATION ARCHITECTURE FOR MULTIPHASE VCO-BASED ADCS

(71) Applicant: Infineon Technologies AG, Neubiberg (DE)

(72) Inventors: Cesare Buffa, Villach (AT); Fernando Cardes Garcia, Leganés (ES); Luis Hernandez-Corporales, Madrid (ES); Carlos Andres Perez Cruz, Santa Cruz del Retamar (ES); Andres Quintero Alonso, Leganés (ES); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/011,272

(22) Filed: Jun. 18, 2018

(51) Int. Cl.
H03M 1/12 (2006.01)
H03M 1/14 (2006.01)
H03M 1/00 (2006.01)
H03M 1/46 (2006.01)

(52) U.S. Cl.
CPC ........... H03M 1/1245 (2013.01); H03M 1/14 (2013.01); *H03M 1/002* (2013.01); *H03M 1/466* (2013.01)

(58) Field of Classification Search
CPC ...... H03M 1/1245; H03M 1/14; H03M 1/002; H03M 1/466
USPC .................................................. 341/155, 120
See application file for complete search history.

(56) References Cited

U.S. PATENT DOCUMENTS

| 4,756,011 A * | 7/1988 | Cordell ................. H04L 7/0338 375/332 |
| 9,369,263 B1 * | 6/2016 | Baecher ................. H04B 17/21 |
| 9,813,282 B2 * | 11/2017 | Liu ....................... H04L 5/0092 |

OTHER PUBLICATIONS

Daniels, J., et al., "All-Digital Differential VCO-based A/D Conversion," Proceedings of 2010 IEEE International Symposium on Circuits and Systems, Paris, May 30-Jun. 2, 2010, pp. 1085-1088.
Kim, Jaewook et al., "Analysis and Design of Voltage-Controlled Oscillator Based Analog-to-Digital Converter," in IEEE Transactions on Circuits and Systems-I: Regular Papers, vol. 57, No. 1, Jan. 2010, pp. 18-30.
Schreier, Richard et al., "Understanding Delta-Sigma Data Converters," ISBN: 978-0-471-46585-0, Piscataway, NJ: Wiley-IEEE Press Home, Circuits and Systems, Circuits and Components, Nov. 2004, 464 pages.

(Continued)

*Primary Examiner* — Brian K Young
(74) *Attorney, Agent, or Firm* — Slater Matsil, LLP

(57) ABSTRACT

An analog-to-digital converter includes a ring oscillator having an input for receiving an analog signal, a coarse Gray code counter having a first input coupled to a first output of the ring oscillator and a second input for receiving a clock signal, a fine counter having first inputs coupled to secondary outputs of the ring oscillator and a second input for receiving the clock signal, a first difference generator having an input coupled to the output of the coarse counter, a second difference generator having an input coupled to the output of the fine counter, and an adder having a first input coupled to the output of the first difference generator, a second input coupled to the output of the second difference generator, and an output for providing a digital signal corresponding to the analog signal.

21 Claims, 9 Drawing Sheets

(56) References Cited

OTHER PUBLICATIONS

Unnikrishnan, V., et al., "Mitigation of Sampling Errors in VCO-Based ADCs," in IEEE Transactions on Circuits and Systems-I: Regular Papers, vol. 64, No. 7, pp. 1730-1739, Jul. 2017.
Watanade, Takamoto et al., "An All-Digital Analog-to-Digital Converter with 12-μV/LSB Using Moving-Average Filtering," in IEEE Journal of Solid-State Circuits, vol. 38, No. 1, Jan. 2003, pp. 120-125.

* cited by examiner

|  b[3:0]  |  g[3:0]  |
|----------|----------|
| 0 0 0 0  | 0 0 0 0  |
| 0 0 0 1  | 0 0 0 1  |
| 0 0 1 0  | 0 0 1 1  |
| 0 0 1 1  | 0 0 1 0  |
| 0 1 0 0  | 0 1 1 0  |
| 0 1 0 1  | 0 1 1 1  |
| 0 1 1 0  | 0 1 0 1  |
| 0 1 1 1  | 0 1 0 0  |
| 1 0 0 0  | 1 1 0 0  |
| 1 0 0 1  | 1 1 0 1  |
| 1 0 1 0  | 1 1 1 1  |
| 1 0 1 1  | 1 1 1 0  |
| 1 1 0 0  | 1 0 1 0  |
| 1 1 0 1  | 1 0 1 1  |
| 1 1 1 0  | 1 0 0 1  |
| 1 1 1 1  | 1 0 0 0  |

Binary Code 302 · Gray Code 304

Fig. 3

COARSE-FINE QUANTIZATION ARCHITECTURE FOR MULTIPHASE VCO-BASED ADCS

TECHNICAL FIELD

The present invention relates generally to a coarse-fine quantization architecture for multiphase voltage controlled oscillator ("VCO") based analog-to-digital converters ("ADC"), and, in particular embodiments, to a system and method for.

BACKGROUND

Low cost digital microphones include a biasing circuit followed by an analog-to-digital converter. The competitiveness of a microphone is mainly given by its performance (power consumption, dynamic range, resolution, as well as other performance features) and its cost (silicon area, package size vs. sensitivity, as well as other cost drivers). Sigma Delta ADCs currently available have been pushed to technology limits and market trends require innovative solutions. VCO-based ADCs are promising alternatives to the conventional voltage encoding-based circuits. For a VCO-ADC built with a multiphase Ring Oscillator ("RO"), the area and power consumption of the quantization circuitry can be reduced with a coarse-fine quantization architecture, using a counter for the integer phase progression (multiples of $2\pi$), and a fine quantization for the fractional part of the phase progression. However, errors resulting from the desynchronization between the coarse and the fine phase estimations, and those caused by direct sampling of the phases, may compromise the ADC performance.

SUMMARY

In accordance with an embodiment of the present invention, an analog-to-digital converter comprises a ring oscillator having an input for receiving an analog signal, and a plurality of outputs; a main Gray code counter having a first input coupled to a first output of the plurality of outputs of the ring oscillator, a second input for receiving a clock signal, and an output; a fine counter having a plurality of first inputs coupled to a plurality of secondary outputs of the plurality of outputs of the ring oscillator, a second input for receiving the clock signal, and an output; a first difference generator having an input coupled to the output of the coarse counter, and an output; a second difference generator having an input coupled to the output of the fine counter, and an output; and an adder having a first input coupled to the output of the first difference generator, a second input coupled to the output of the second difference generator, and an output for providing a digital signal corresponding to the analog signal.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is an example of a binary code and Gray code used in the ADC of FIGS. 2A and 2B;

DETAILED DESCRIPTION OF ILLUSTRATIVE EMBODIMENTS

Figure 1:
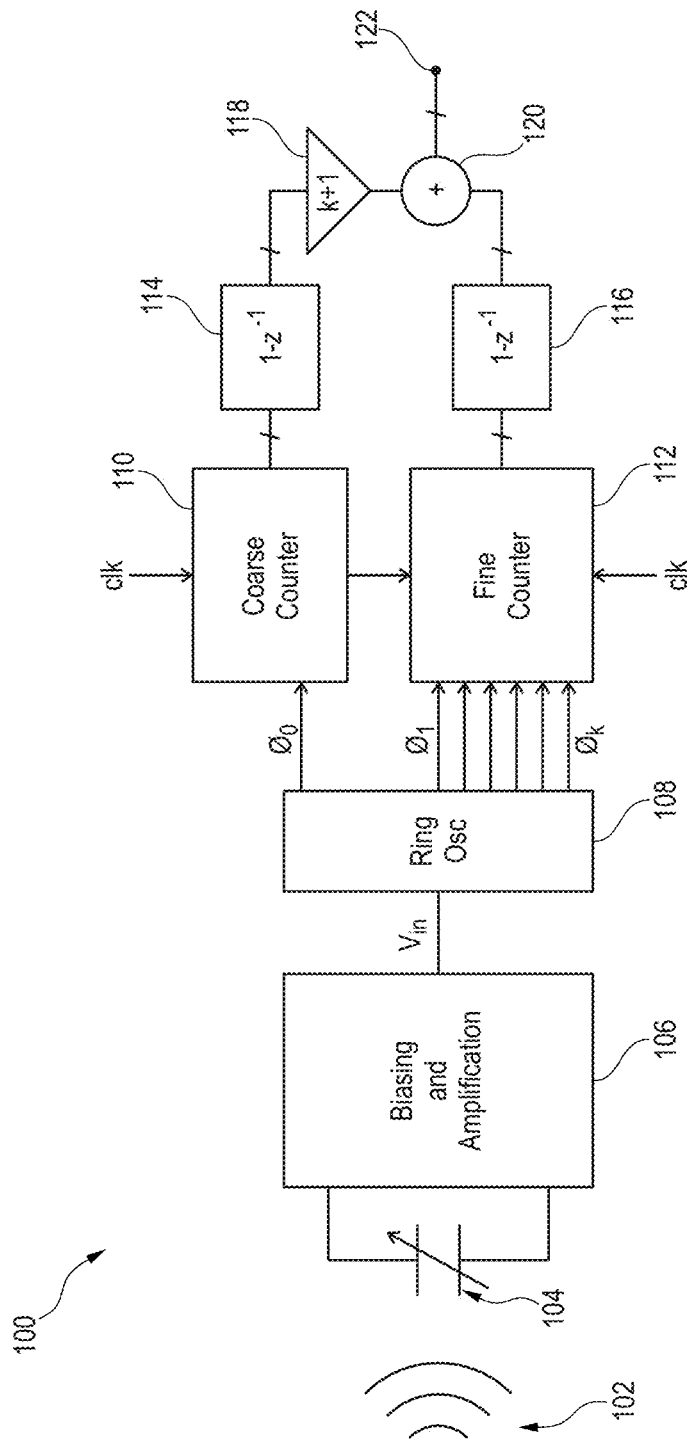
FIG. 1 is a block diagram of a microphone coupled to an ADC according to an embodiment.

FIG. 1 is a block diagram 100 of a microphone coupled to an ADC according to an embodiment. The microphone includes a variable capacitor 104 coupled to biasing and amplification circuitry 106 for receiving audio signals 102 and for generating an analog voltage, $V_{IN}$. The ADC converter includes a Ring Oscillator 108 having an input for receiving the analog voltage, VIN, and a plurality of outputs for generating a plurality of phase signals. A main or primary phase signal is designated $\phi_0$ and a plurality of secondary phase signals are designated $\phi_1$ through $\phi_K$. In an embodiment, the phase shift between the output phase signals $\phi_0$ through $\phi_K$ is evenly spaced in increments of $2\pi$ divided by the number of Ring Oscillator 108 outputs used. A coarse counter no has a first input for receiving the main phase signal $\phi_0$ and a second input for receiving a system clock (CLK) signal. The coarse counter no also has a bus output for providing multiple digital bits of an output count value. A fine counter no has a plurality of first inputs for receiving the secondary phase signals $\phi_1$ through $\phi_K$ and a second input for receiving the system clock (CLK) signal. The fine counter 112 also has a bus output for providing multiple digital bits of an output count value. A difference generator 114 is used to calculate the difference between the current value of the coarse counter no output and a previous value of the coarse counter no output. Similarly, a difference generator 116 is used to calculate the difference between the current value of the fine counter 112 output and a previous value of the fine counter 112 output. Difference generators 114 and 116 can also be called "first difference generators" to denote that the difference being calculated is between immediately adjacent samples of the corresponding counters. A gain stage 118 receives the output of the coarse counter. The outputs of the gain stage 118 and the difference generator 116 are added together by adder 120. The output of adder 120 is the output 122 of the ADC, which is a digital bus having a digital word representing the corresponding analog input signal $V_{IN}$, according to an embodiment.

Figure 2A:
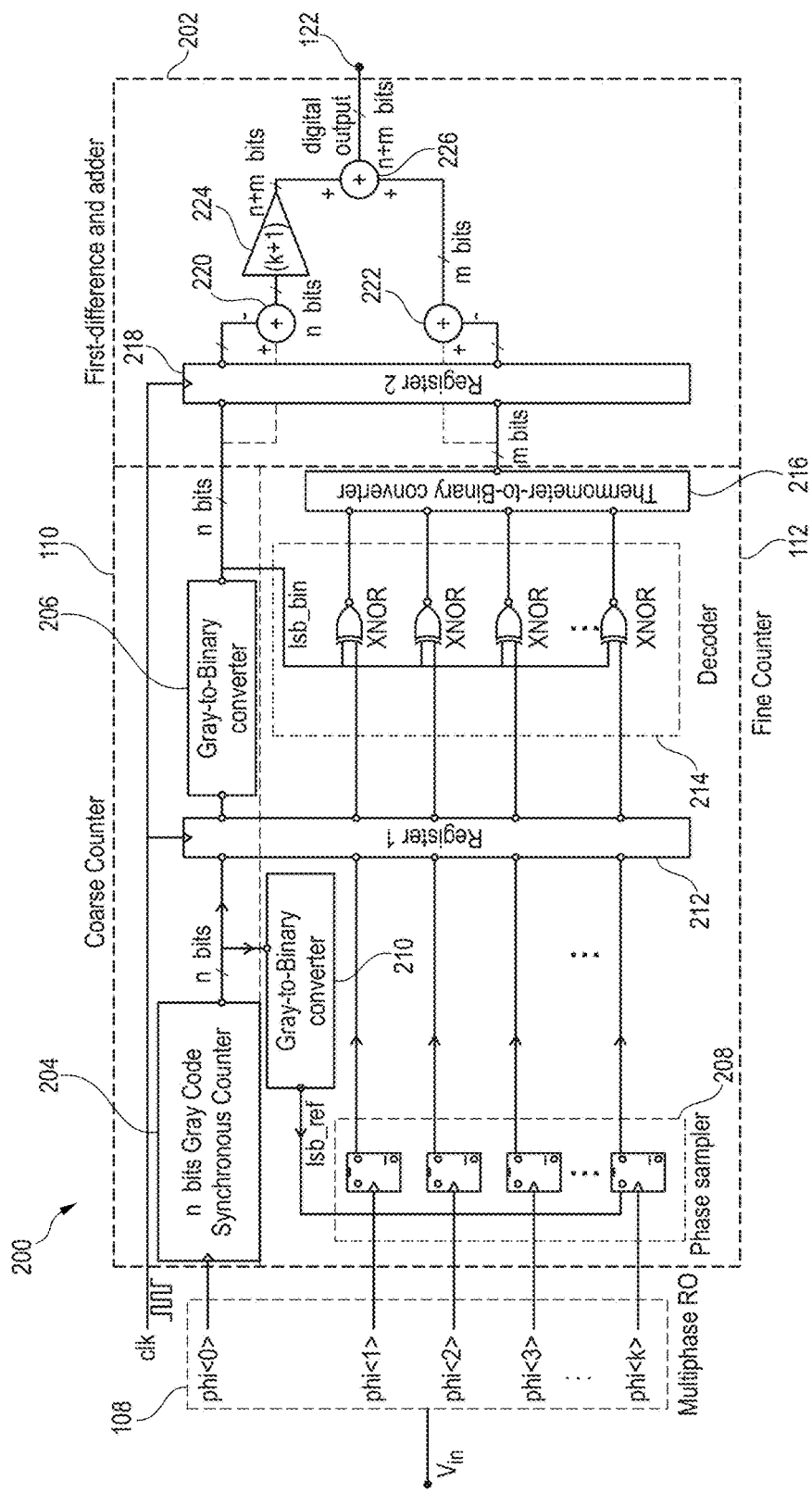
FIG. 2A is a more detailed block diagram of the ADC of FIG. 1.

FIG. 2A is a more detailed block diagram 200 of the ADC of FIG. 1. The major blocks shown in FIG. 2A are the multiphase RO 108, the coarse counter 110, fine counter 112, and first-difference generator and adder 202. Each of these main blocks are explained in further detail below with reference to sub-blocks. The microphone 104, 106 is not shown in FIG. 2A for sake of clarity. The analog input signal $V_{IN}$ can actually be provided by any input source as is desired for a particular application.

The multiphase RO 108 has been previously described.

The coarse counter no includes an "n" bit Gray code synchronous counter 204 having an "n" bit output bus. An example of a Gray code count 304 is shown in FIG. 3.

Returning to FIG. 2A, the Gray code synchronous counter 204 performs the coarse phase accumulation for multiples of 2π. Counter 204 is a rising edge sensitive counter in an embodiment, which is connected to one of the main output phases of the RO 108 (phi<0> in the FIG. 2A). The Gray encoded characteristic mitigates partial sampling errors when the sampling clock matches with the counter update. Using the Gray code type of codification means that adjacent codes differ by a Hamming distance of one, and therefore the resultant errors under this condition are limited to one LSB. The number of bits "n" are properly selected in accordance with the ratio between the maximum oscillation frequency of the RO 108 and the system clock frequency CLK. The output of the Gray code counter 204 is an output bus of "n" bits having the Gray code count 304 shown in FIG. 3.

A first register 212 has a first input coupled to the output of the Gray code counter 204. The first register 212 has an additional input for receiving the CLK signal. The first register 212 is used for sampling the Gray code counter 204 output using the system CLK signal and is described in further detail below.

A Gray code-to-binary code converter 206 has an input coupled to an output of the first register 212. The output of the converter 206 is "n" bits wide. An example of binary code 302 to Gray code 304 conversion is shown in the logic table 300 of FIG. 3. The binary code count b[3:0] 302 ranges from a count of 0000 to 1111 and has a least significant bit ("LSB") that alternates between a logic zero and a logic one for successive counts. In contrast, the Gray code count g[3:0] 304 ranges from a count of 0000 to 1000 and has an LSB that alternates between a logic zero and a logic one for every two successive counts.

The fine counter 112 includes a phase sampler 208 having a plurality of inputs for receiving the secondary phase signals from the RO 108 shown as phi<1> through phi<k> in FIG. 2A. Another input of phase sampler 208 receives the LSB from a Gray code-to-Binary code converter 210. Converter 210 receives all "n" bits from the output of Gray code counter 204, previously described. The phase sampler 208 includes a plurality of outputs corresponding to the plurality of inputs. In an embodiment, phase sampler 208 comprises a plurality of D flip-flops wherein the rising edge sensitive CLK inputs of the D flip-flops are configured to respectively receive the plurality of secondary phase signals, and the D inputs are coupled together to receive the LSB signal from the Gray code-to-binary code converter 210, labeled lsb_ref. The Q outputs of the D flip-flops provide the plurality of outputs of the phase sampler 208. The outputs of phase sampler 208 are coupled to additional inputs of the first register 212.

In operation, the phase sampler 208 performs the fine phase accumulation. Note that lsb_ref signal is equivalent to the RO phi<0> signal with its frequency divided by a factor of two.

Figure 5:
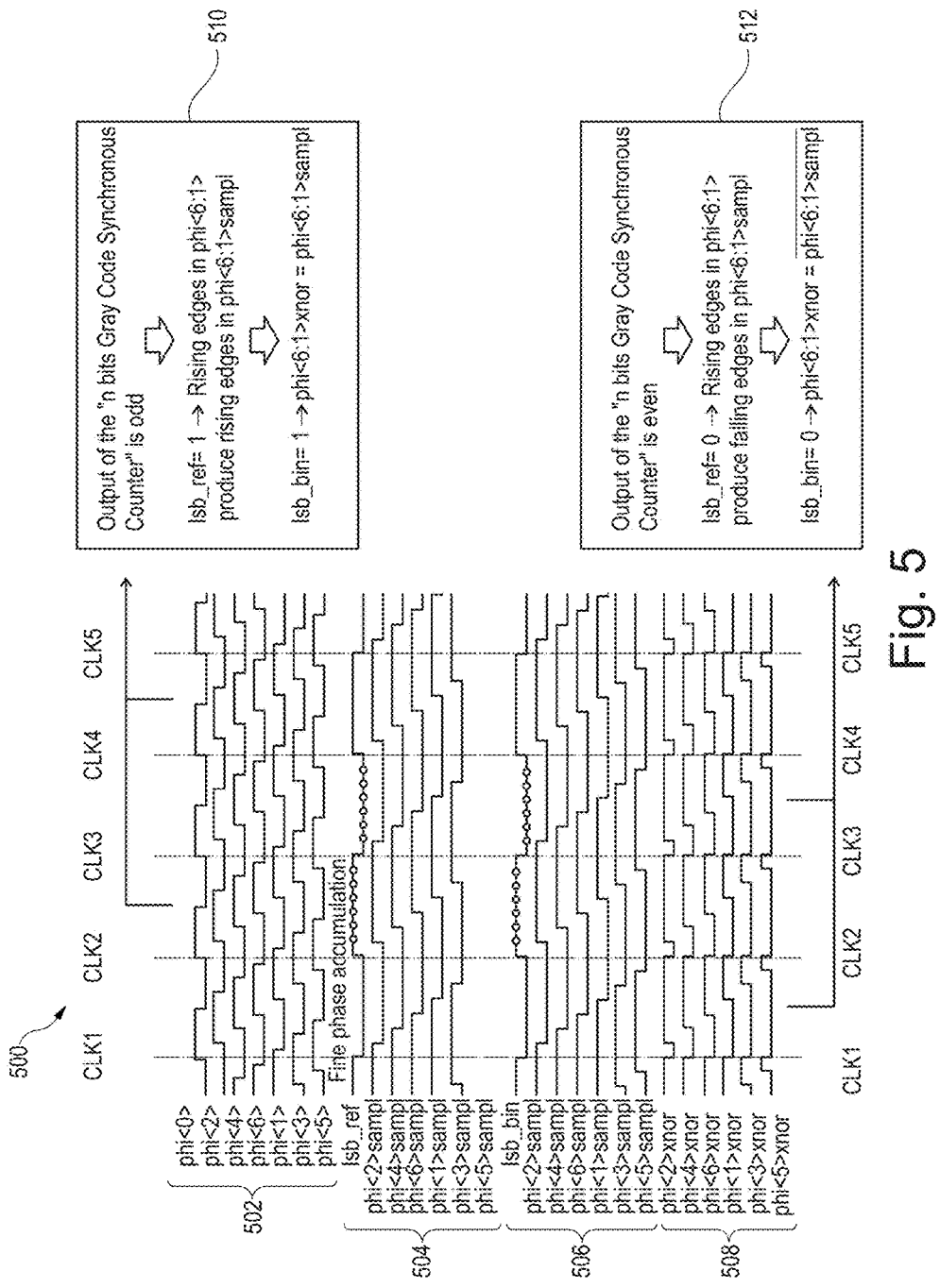
FIG. 5 is a timing diagram of the ADC of FIGS. 2A and 2B.

The first register 212 samples the output of counter 204 (in Gray code) and the phase sampler 208 output with the system CLK clock signal. After this point, sampled data of the Gray code counter 204 are converted to a binary code of "n" bits as is described in further detail below. With an array of k XNOR gates, also described below, and using the LSB of this converted value (lsb_bin), the sampled data of the phase sampler 208 outputs take the zero value at every rising edge of phi<0> (rising and falling edges of lsb_ref) and the one value with the corresponding rising edge in the phases phi<1:k>, as is shown in FIG. 5. Therefore, the number of logic one values represent the rising edges in the output phases of the RO 108 (phi<1:k>) and the sum of these logic one values are used for the fine phase estimations. The operational details are described below with respect to the timing diagram of FIG. 5.

Returning to FIG. 2A, a decoder 214 has a plurality of first inputs coupled to the secondary outputs of the first register 212, and a second input for receiving the LSB signal, lsb_bin, from the Gray code-to-binary code converter 206. As previously described, decoder 214 comprises a plurality of XNOR gates wherein one of the inputs of the XNOR gates are used to form the plurality of first inputs. Another of the inputs of the XNOR gates are coupled together to receive the LSB signal, lsb_bin. The inverted outputs of the XNOR gates respectively provide the plurality of outputs of the decoder 214.

A thermometer code-to-binary code converter 216 is used to convert the outputs of the decoder 214 into a binary code having a width of "m" bits. Converter 216 performs the counting of the number of logic ones for the fine phase estimations. The number of output bits is given by the equation "m"=ceiling ($\log_2$ k). Thus, in FIG. 2A the output of the coarse counter 110 is shown to be "n" bits wide, whereas the output of the fine counter 112 is shown to be "m" bits wide. More generally, the converter 216 provides a "ones counting function" if a different ordering of the phase signals is used and need not be limited to the thermometer code implementation in embodiments.

The remaining block shown in FIG. 2A is the first-difference and adder block 202, which comprises a second register 218, adder 220, adder 222, gain stage 224, and adder 226. Block 202 includes inputs for receiving the "n" bit data from the coarse counter 110, the "m" bit data from the fine counter 112, and an output 122 for providing a digital signal having a width of "n+m" bits, which is a digital signal corresponding to the analog input signal, $V_{IN}$. The second register 218 includes a first input coupled to the output of the coarse counter 110, and a second input coupled to the output of the fine counter 112. The second register 218 samples the previous outputs of the counters. A coarse counter difference (coarse phase difference) is generated by adder 220 and a fine counter difference (fine phase difference) is generated by adder 222. The coarse phase difference is multiplied by the total number of output phase of the RO 108 (k+1) by gain stage 224, and the fine phase difference is added to obtain the final digital output data signal having a width of n+m bits at output node 122.

Figure 2B:
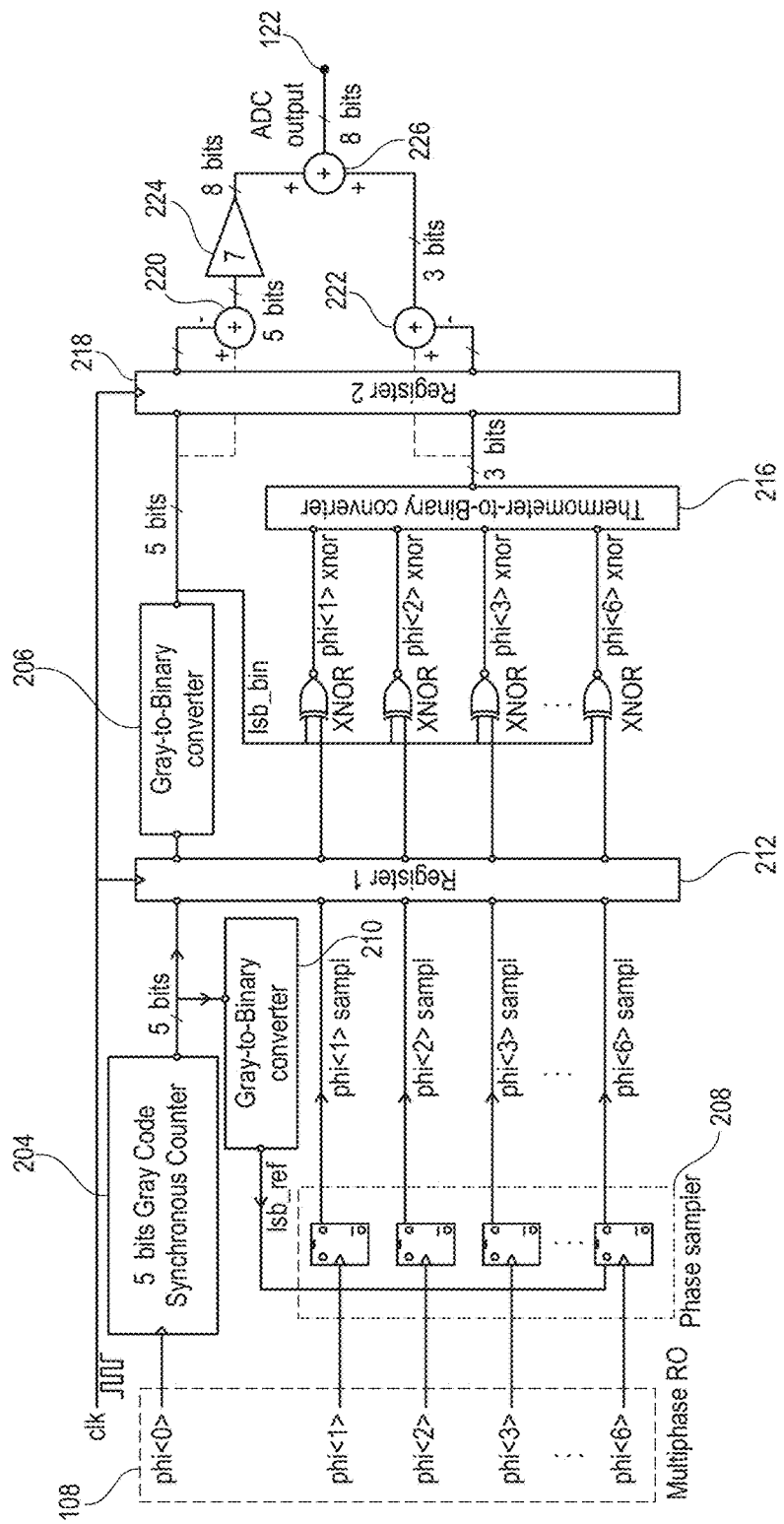
FIG. 2B is the block diagram of FIG. 2A including specific values used in an embodiment.

FIG. 2B shows an embodiment of the ADC 200 wherein k=6, n=5, m=3, and n+m=8. Other values for these constants can be used in other embodiments.

Figure 4:
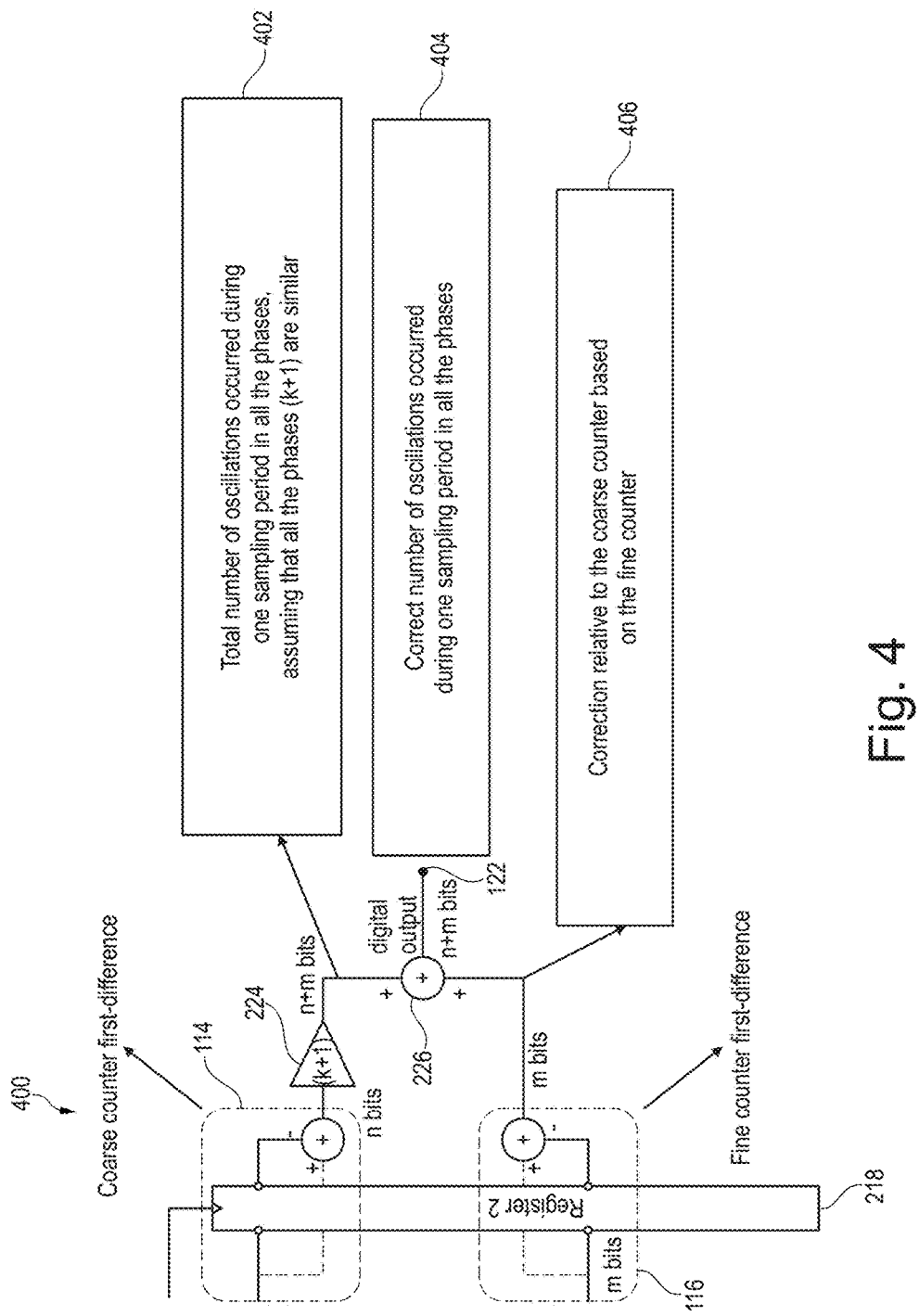
FIG. 4 is a more detailed block diagram of the difference generators used in the ADC of FIGS. 2A and 2B.

The coarse counter first-difference 114 and the fine counter first difference are shown in further detail in the schematic 400 of FIG. 4. FIG. 4 includes a portion of the ADC comprising the second register 218, the coarse counter first-difference generator 114, the fine counter first-difference generator 116, gain stage 224, and adder 226. It is noted at 402 that the output of gain stage 224 includes the total number of oscillations that have occurred during one sampling period in all of the phases, assuming that all of the phases (k+1) are similar. It is further noted at 406 that the output of the fine counter first-difference generator 116 is a correction relative to the coarse counter that is based on the fine counter. Finally, it is noted at 404 that the output node 122 includes the correct number of oscillations occurred during one sampling period in all of the phases. It is further noted that the digital output signal at node 122 is substantially without synchronization errors as will be apparent from a description of the timing diagram of FIG. 5 given below.

FIG. 5 is a timing diagram 500 of the ADC of FIGS. 2A and 2B. A first set of signals 502 are the phase signals phi<0> through phi<k> at the input of the coarse counter no and at the inputs of the fine counter 112. A second set of signals 504 show the lsb_ref signal and the phase sampler 208 output signals phi<1> sampl through phi<k> sampl. A third second set 506 of signals show the lsb_bin signal and the first register 212 output signals phi<i> sampl through phi<k> sampl. Finally, a fourth set 508 of signals show the output signals of the decoder 214 designated phi<1> xnor through phi<k> xnor. Also shown in FIG. 5 are occurrences of the system clock at CLK1, CLK2, CLK3, CLK4, and CLK5.

Signals 508 are only for purposes of illustration. Signals 508 show the operation of the XNOR-based decoder 214, where for every rising edge of the secondary phases of the RO phase signals (phi<1:k>) there is an equivalent logic "one" at the decoder 214 outputs. Signals 508 change their values according to the expressions shown in blocks 510 and 512 of FIG. 5, at the CLK rate. The phi<1:6> xnor signals are also shown in the timing diagram of FIG. 8.

The rising edges of the phi<0> phase signal shown in signal set 502 are used to perform the coarse phase accumulation that is ultimately used to generate the "n" bit digital output signal.

Assuming k=6, FIG. 5 thus shows the output phases of an arbitrary RO, the generated lsb_ref signal and the signal at the output of the D flip-flops (phi<1> sampl through phi<6> sampl). Here, with the rising edges of phi<1:6>, lsb_ref is sampled in the respective D flip-flop of the phase sampler 208. With subsequently handling, these sampled data can be used for the fine phase estimations. FIG. 5 thus shows the operation of the phase sampler for a 7-stage ring oscillator. Each rising edge in the main phase signal (phi<0>) toggles the lsb_ref signal, which, in an embodiment, is used as reference for the phase sampler 208. When the lsb_ref signal equals a logic one, each rising edge in the phi<6:1> signals produces a corresponding rising edge in the phi<6:1> sampl signals, whereas if lsb_ref equals a logic zero, rising edges in the phi<6:1> signals generate falling edges in the phi<6:1> sampl signals.

With an array of k XNOR gates of decoder 214 and using the LSB of the converted value (lsb_bin), the sampled data of the phase sampler 208 outputs take the logic zero value at every rising edge of phi<0> (rising and falling edges of lsb_ref) and logic one with the corresponding rising edge in the phases phi<1:k>, as is also shown in FIG. 5. Therefore, the number of logic ones represents the rising edges in the output phases of the RO (phi<1:k>) and the sum of these logic ones are used for the fine phase estimations. FIG. 5 thus shows the operation of the XNOR-based phase decoder 214, which inverts the value of the phi<6:1> sampl signals when lsb_bin=equals a logic zero to transform the falling edges in phi<6:1> sampl into rising edges. In this way, the inversion introduced when the lsb_ref signal equals a logic zero is reverted to the original polarity.

The above description is reproduced in equation form in FIG. 5 at blocks 510 and 512.

Figure 6:
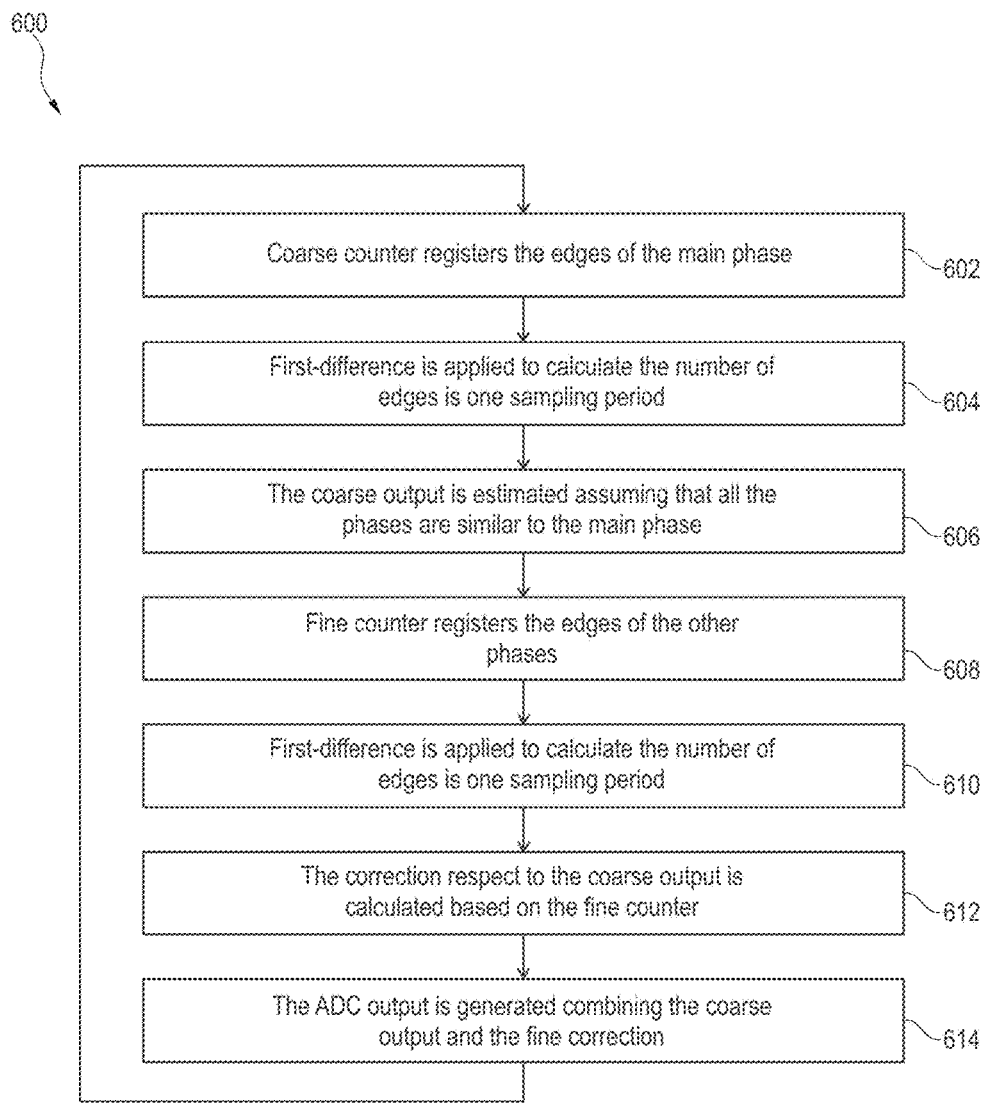
FIG. 6 is a flow chart of an analog to digital conversion method according to an embodiment.

FIG. 6 is a flow chart 600 of an analog to digital conversion method according to an embodiment. The coarse counter 110 registers the edges of the main phase signal phi<O> at step 602. A first-difference of the coarse counter 110 output is then applied to calculate the number of edges in one sampling period at step 604. The coarse output is then estimated using gain stage 224 assuming that all of the phases are similar to the main phase at step 606. In parallel, the fine counter 112 registers the edges of the other phases phi<1> through phi<k> at step 608. A first-difference of the fine counter is then applied to calculate the number of edges in one sampling period at step 610. The correction with respect to the "n" bit coarse output is then calculated based on the "m" bit correction data of the fine counter 112 at step 612. The ADC output is generated by combining the coarse output and the fine counter correction data at step 614.

Figure 7:
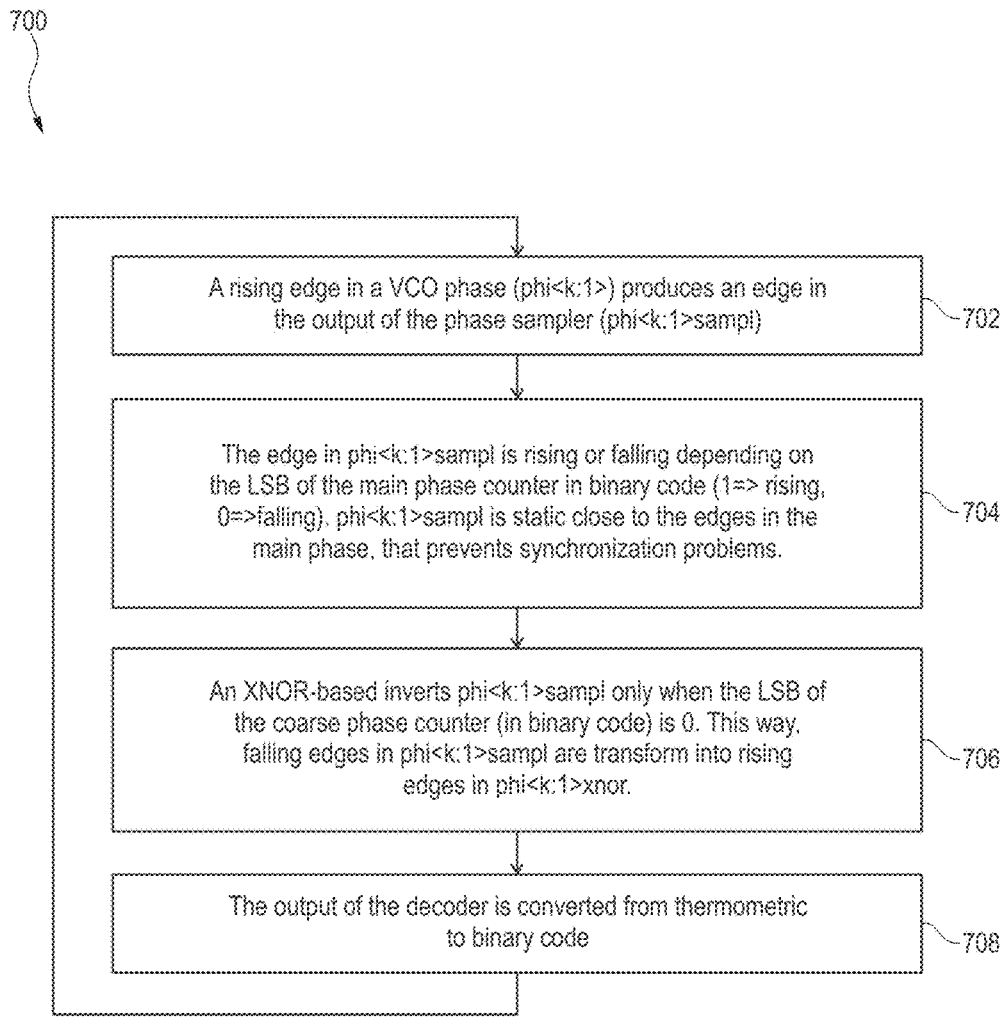
FIG. 7 is a flow chart of a "fine counter registers the edges of the other phase" step associated with the flow chart of FIG. 6.

FIG. 7 is a flow chart 700 of the "fine counter registers the edges of the other phase" step 608 associated with the flow chart 600 of FIG. 6. A rising edge in a VCO phase signal (phi<k:1>) produces an edge in the output of the phase sampler 208 (phi<k:1> sampl) at step 702. The edge in the phi<k:1> sampl signal rises or falls depending on the LSB of the main phase counter no in binary code ("1"=> rising, "0"=> falling). The phi<k:1> sampl signals are static close to the edges in the main phase signal, which prevents synchronization problems at step 704. An XNOR-based decoder inverts the phi<k:1> sampl signals only when the LSB of the coarse phase counter 110 (in binary code) is zero. In this way, falling edges in the phi<k:1> sampl signals are transformed into rising edges in the phi<k:1> xnor signals at step 706. Finally, the output of the decoder 214 is converted from thermometric code to binary code at step 708 (or ones are counted if a different order of the phase signals is used).

Figure 8:
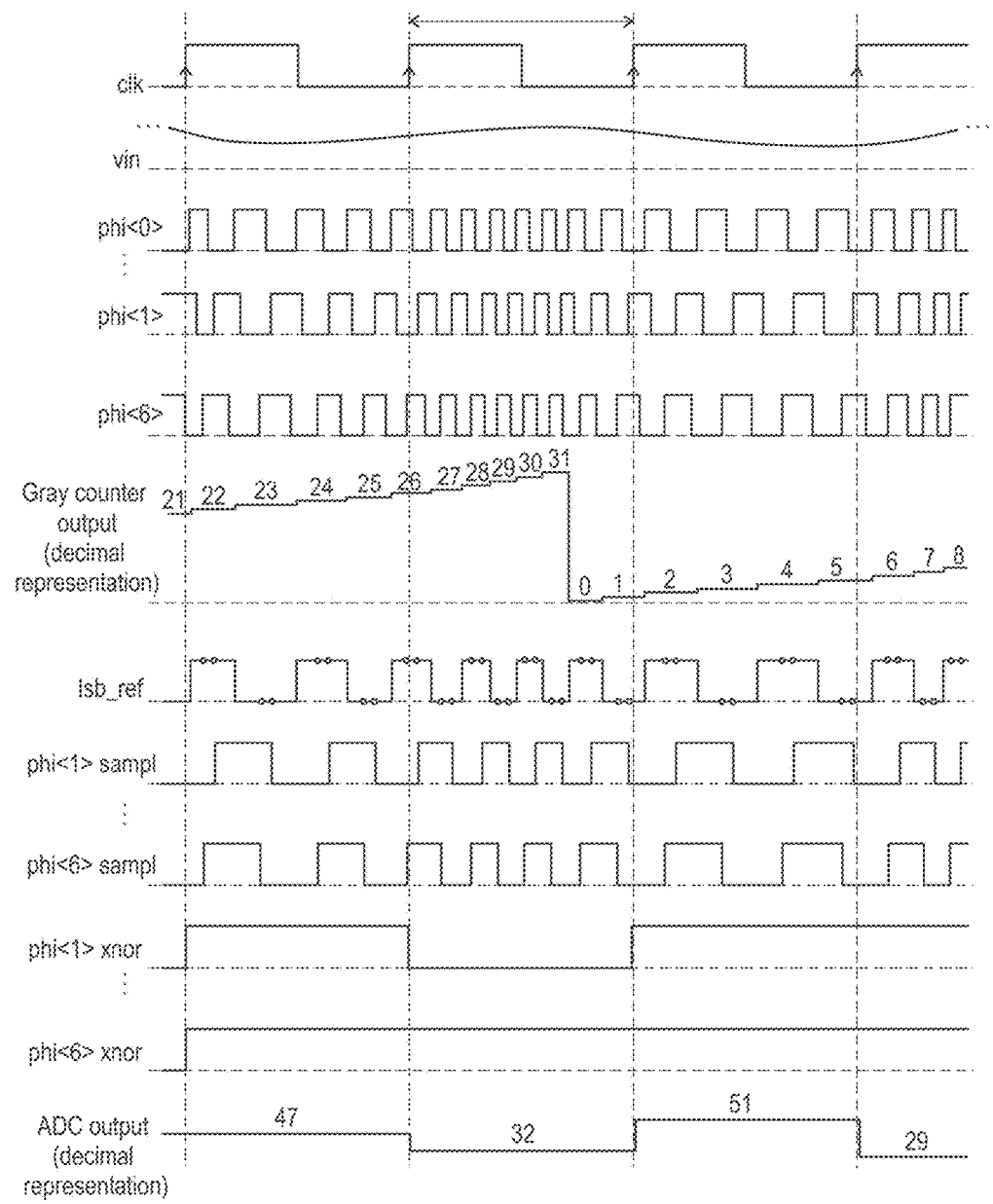
FIG. 8 is another timing diagram associated with an embodiment ADC.

FIG. 8 is an additional ADC embodiment timing diagram showing the CLK signal, a slowly varying VIN analog input signal, various internal circuit node signals previously shown and described, and the final ADC output signal in a decimal representation. Thus, the progression of the ADC circuit signals from the input analog signal to the final digital output signal can be seen. The internal circuit signals shown include phase signals phi<0> through phi<6>, the Gray counter output in a decimal representation, the lsb_ref signal, and phase signals phi<1> sampl through phi<6> sample, phase signals phi<1> xnor through phi<6> xnor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital converter comprising:
a ring oscillator having an input for receiving an analog signal, and a plurality of outputs;
a coarse counter having a first input coupled to a first output of the plurality of outputs of the ring oscillator, a second input for receiving a clock signal, and an output;
a fine counter having a plurality of first inputs coupled to a plurality of secondary outputs of the plurality of outputs of the ring oscillator, a second input for receiving the clock signal, and an output;
a first difference generator having an input coupled to the output of the coarse counter, and an output;
a second difference generator having an input coupled to the output of the fine counter, and an output; and
an adder having a first input coupled to the output of the first difference generator, a second input coupled to the output of the second difference generator, and an output for providing a digital signal corresponding to the analog signal.

2. The analog-to-digital converter of claim 1, wherein an intermediate node of the coarse counter is coupled to an intermediate node of the fine counter.

3. The analog-to-digital converter of claim 1, further comprising a gain stage interposed between the output of the first difference generator and the first input of the adder.

4. The analog-to-digital converter of claim 1, wherein the plurality of outputs of the ring oscillator are configured for providing a plurality of evenly spaced phase signals.

5. The analog-to-digital converter of claim 1, wherein the coarse counter comprises:
a Gray code counter having an input coupled to the first input of the coarse counter, and an output;
a first register having an input coupled to the output of the Gray code counter, and an output; and
a Gray code-to-binary code converter having an input coupled to the output of the first register, and an output coupled to the output of the coarse counter.

6. The analog-to-digital converter of claim 5, wherein the fine counter comprises:
a Gray code-to-binary code converter having an input coupled to the output of the Gray code counter of the coarse counter, and an output;
a phase sampler having a plurality of first inputs coupled to the plurality of first inputs of the fine counter, a second input coupled to the output of the Gray code-to-binary code converter, and an output coupled to the input of the first register; and
a decoder having an input coupled to the output of the first register, and an output coupled to the output of the fine counter.

7. The analog-to-digital converter of claim 6, further comprising a ones counting circuit interposed between the output of the decoder and the output of the fine counter.

8. The analog-to-digital converter of claim 6, wherein the phase sampler comprises a plurality of D flip-flops.

9. The analog-to-digital converter of claim 6, wherein the decoder comprises a circuit configured for implementing an XNOR logic function.

10. The analog-to-digital converter of claim 1, wherein the first difference generator comprises a second register configured for determining a difference between a current value and a previous value of the output of the coarse counter.

11. The analog-to-digital converter of claim 1, wherein the second difference generator comprises a second register configured for determining a difference between a current value and a previous value of the output of the fine counter.

12. A method for converting an analog signal into a digital output comprising:
converting the analog signal into a plurality of phase signals including a primary phase signal and a plurality of secondary phase signals;
registering edges of the primary phase signal using a Gray code count;
calculating a number of the registered edges of the primary phase signal during a sampling period;
estimating a coarse output based upon the calculated number of registered edges of the primary phase signal during the sampling period;
registering edges of the plurality of secondary phase signals;
calculating a number of the registered edges of the plurality of secondary phase signals during the sampling period;
generating a correction output based upon the calculated number of registered edges of the plurality of secondary phase signals during the sampling period; and
adding the coarse output and the correction output together to provide the digital output.

13. The method of claim 12, wherein registering the edges of the plurality of secondary phase signals is substantially asynchronous with registering the edges of the primary phase signal.

14. The method of claim 12, wherein registering the edges of the plurality of secondary phase signals comprises phase sampling the plurality of secondary phase signals to generate a plurality of sampled secondary phase signals.

15. The method of claim 14, wherein registering the edges of the plurality of secondary phase signals further comprises selectively inverting the plurality of sampled second phase signals in response to a first least significant bit of a count of the calculated number of the registered edges of the primary phase signal during the sampling period.

16. The method of claim 15, wherein registering the edges of the plurality of secondary phase signals further comprises decoding the selectively inverted plurality of sampled second phase signals to provide a plurality of decoded signals.

17. The method of claim 16, wherein registering the edges of the plurality of secondary phase signals further comprises inverting the decoded signals when a second least significant bit of the count of the calculated number of the registered edges of the primary signal during the sampling period is zero.

18. The method of claim 17, wherein registering the edges of the plurality of secondary phase signals further comprises counting logic ones of the inverted decoded signals.

19. A counter comprising:
a phase sampler having a plurality of first inputs configured for receiving a plurality of phase signals, a second input configured for receiving a first least significant bit signal, and a plurality of outputs;
a register having a plurality of first inputs coupled to the plurality of outputs of the phase sampler, a second input for receiving a clock signal, and a plurality of outputs; and
a decoder having a plurality of first inputs coupled to the plurality of outputs of the register, a second input configured for receiving a second least significant bit signal different from the first least significant bit signal, and a plurality of outputs.

20. The counter of claim 19, further comprising a ones counting circuit coupled to the plurality of outputs of the decoder, and an output for providing a digital signal.

21. A counter comprising:
a phase sampler having a plurality of first inputs configured for receiving a plurality of phase signals, a second input configured for receiving a first least significant bit signal, and a plurality of outputs;
a register having a plurality of first inputs coupled to the plurality of outputs of the phase sampler, a second input for receiving a clock signal, and a plurality of outputs;
a decoder having a plurality of first inputs coupled to the plurality of outputs of the register, a second input configured for receiving a second least significant bit signal, and a plurality of outputs; and
a ones counting circuit coupled to the plurality of outputs of the decoder, and an output for providing a digital signal.

* * * * *